United States Patent [19]

Baker

[11] 4,347,445
[45] Aug. 31, 1982

[54] FLOATING HYBRID SWITCH

[75] Inventor: Richard H. Baker, Bedford, Mass.

[73] Assignee: Exxon Research and Engineering Co., Florham Park, N.J.

[21] Appl. No.: 108,523

[22] Filed: Dec. 31, 1979

[51] Int. Cl.³ ............... H03K 17/687; H03K 19/092
[52] U.S. Cl. .................... 307/255; 307/270; 307/574; 307/475; 307/311
[58] Field of Search ............ 307/475, 255, 270, 311, 307/572, 574, 575, 576, 579

[56] References Cited

U.S. PATENT DOCUMENTS

| | | | |
|---|---|---|---|
| 3,728,556 | 4/1973 | Arnell | 307/475 |
| 3,798,466 | 3/1974 | Cheney | 307/475 |
| 3,911,294 | 10/1975 | Davis et al. | 307/270 |
| 4,129,792 | 12/1978 | Kawagai et al. | 307/270 |
| 4,266,149 | 5/1981 | Yoshida | 307/270 |

FOREIGN PATENT DOCUMENTS 54-134547 10/1979 Japan .................. 307/270

Primary Examiner—Stanley D. Miller, Jr.
Assistant Examiner—B. P. Davis
Attorney, Agent, or Firm—Kenneth Watov

[57] ABSTRACT

A high-current VMOS transistor having a source connected to a floating reference voltage terminal is switched between conducting and non-conducting states by a low power source including complementary-symmetry FET's. When the VMOS is back biased a low impedance path having a constant predetermined voltage exits between the VMOS source and drain via one of the bipolar transistors. This prevents false triggering of the VMOS if the reference voltage drops below a nominal value. A diode polarized to pass current oppositely from the source drain path and in shunt with the source drain path prevents the VMOS from conducting if the reference voltage rises above the nominal value. The bipolar transistors are shunted by a zener diode to maintain a predetermined voltage across the bipolar transistors, i.e. between the reference voltage terminal and a terminal connected through a load resistor to a power supply terminal.

9 Claims, 2 Drawing Figures

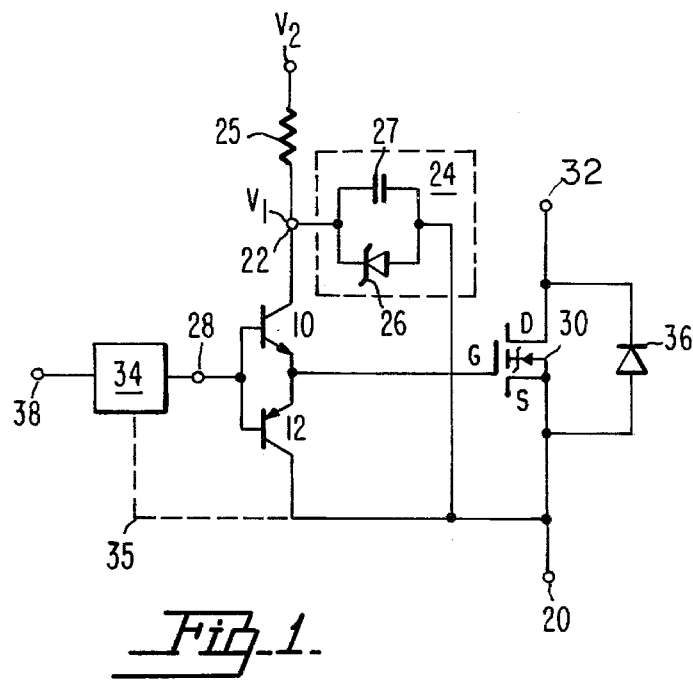
_Fig_1._
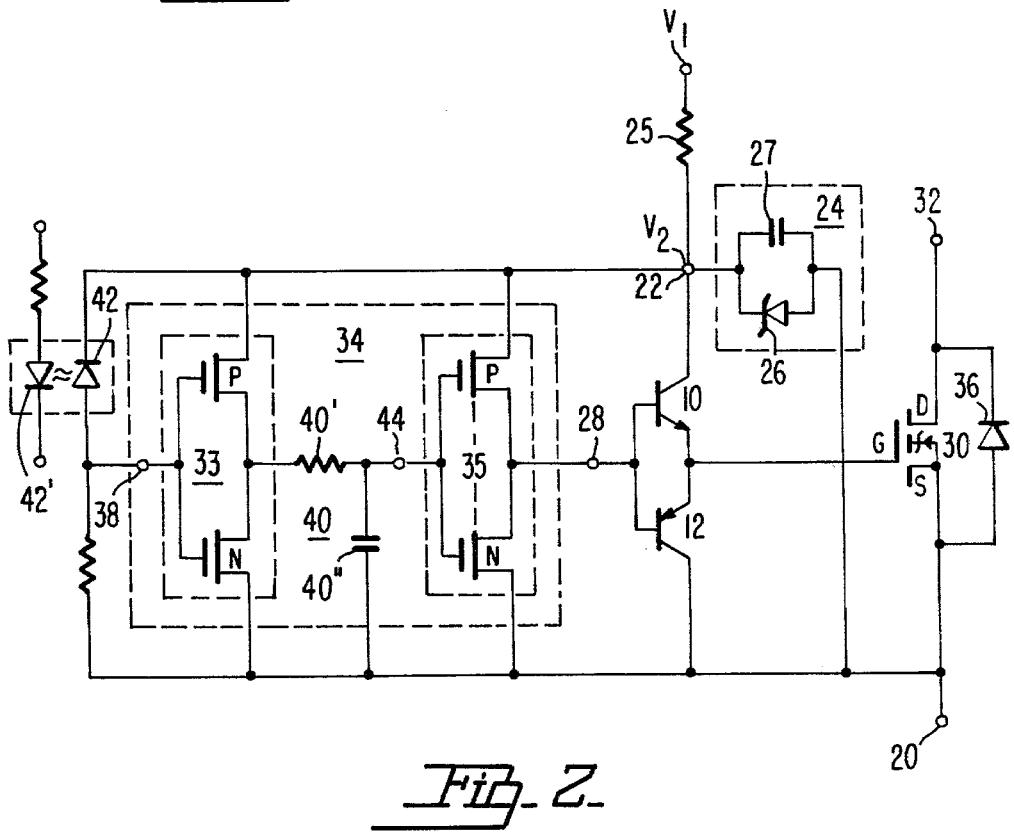
_Fig_2._

FLOATING HYBRID SWITCH

FIELD OF THE INVENTION

The present invention relates to low power level switching of high current carrying devices and more particularly to circuitry employing a combination of complementary-symmetry arranged unipolar and bipolar transistor devices in conjunction with a vertical metal oxide semiconductor to provide high current switching capability responsive to relatively low power control of same while concurrently inhibiting false triggering of the switching circuit caused by circuit transients.

BACKGROUND OF THE INVENTION

Interfacing low power level, high speed digital-type switching circuitry with high current capability devices has previously required a compromise of several desired circuit parameters including switching speed, noise suppression, operating frequency range, power dissipation and circuit complexity. The increasingly diverse application of low power level logic circuitry to relatively high current analog circuit applications mandates careful consideration of interface circuitry capabilities since the interface circuitry often establishes the limiting parameters in digital controlled analog operations, diminishing the value of such control systems. The circuitry of the present invention provides low power, high speed switching capability over a wide frequency range using relatively few circuit components. This inventive circuitry utilizes a hybrid network of complementary-symmetry arranged bipolar and unipolar transistors to control the high current switching of vertical metal oxide semiconductor transistors, hereinafter referred to as VMOS transistors. The circuitry of the present invention provides efficient high current switching capability controlled by relatively low power level logic type devices.

Many applications of such interface circuitry further require isolation or inhibiting means to prevent false triggering of the circuit switching devices. For purposes of the present invention, false triggering is generally caused by fluctuations in circuit reference potentials. The circuitry of the present invention utilizes a novel structure for floating the circuit reference potential, that is, allowing the reference potential to vary at, above, or below ground potential in a manner to substantially follow an output reference potential, compensating the switching devices for output voltage fluctuations. The effects of input signal transients are suppressed by a plurality of complementary-symmetry arranged metal oxide semiconductor field effect transistors having threshold switching voltages approximately equal to about one-half of an anticipated signal input.

PRIOR ART

Numerous techniques have been proposed for interfacing low power level circuitry with high power switching applications. Furthermore, those of the art well recognize the need for isolating such circuitry from the influence of transient signals. For instance, the well-known complementary-symmetry arrangement of metal oxide semiconductor field effect transistors, hereinafter COS/MOS FET, has been widely employed as an inverter-amplifier to provide low signal power, low power dissipation switching capability.

In the complementary-symmetry arrangement, series connected P and N channel field effect transistors typically switch from a conductive to nonconductive state (and symmetrically vice-versa for the complementary device) at about 45% of the supply voltage for the transistors, providing noise immunity to false or transient input signals.

Those of the art recognize, however, that large capacitive loading and/or high switching rate requirements substantially deteriorate the rise and fall times of the COS/MOS FET switching device, diminishing its utility in such applications. Prior technology has, in part, resolved this problem by utilizing the COS/MOS FET to drive bipolar transistor circuitry. For example, in U.S. Pat. No. 3,636,372, Hujita et al disclose a high-speed, low power switching circuit having a bipolar transistor coupled to the output of single or cascaded COS/MOS FET amplifiers. Others in the art have recognized the ability of the circuit to provide rapid charging and discharging of capacitive loads and extended the technology to positive and negative polarity signals. In U.S. Pat. No. 3,541,353, for example, Seelback et al teaches the use of COS/MOS FET's (therein referred to as IGFETS) cascaded to one or more stages of complementary bipolar transistors. Seelback et al further recognized the noise immunity of the COS/MOS FET network, noting that the switching threshold of the transistors occurs at about half the input voltage swing. As noted therein, the COS/MOS FET network automatically tracks the positive supply voltage, maintaining a threshold voltage of about one-half the supply voltage. In essence, the prior art has recognized that cascaded complementary-symmetry arranged field effect and bipolar transistors provide high input impedance as well as, increased switching speed capability for relatively high output current applications.

Those of the art realize, however, that bipolar transistors require relatively high base drive current which may cause undesired effects in the switched signal. Furthermore, the bipolar transistor is a minority carrier device, having a temperature dependent conduction mechanism, inherently capable of producing thermal runaway of the device. More importantly, COS/MOS FET driven bipolar switching circuitry substantially increases the rise and fall time of the switched signal, distorting the output signal waveform relative to the input signal. To overcome these switching deficiencies, the art has employed bipolar driven VMOS circuitry. For example, L. Shaeffer et al in *Electronics Industry*, Vol. 4, April 1978 and *VMOS Power FET's Design Catalog*, May 1978, disclose circuitry utilizing digital control of bipolar driven VMOS transistors for relatively high current switching applications. The prior art circuits, however, are susceptible to reference potential transients which typically result in a false or unwanted triggering of the VMOS switching device. To overcome this deficiency, the present invention provides output reference potential tracking means to suppress reference potential transient effect upon the switching performance of the circuitry. Reference potential tracking, in addition to the suppression capability of the complementary-symmetry arrangement, provides substantially improved transient-free high current switching capability controlled by low power level, digital-type circuitry.

SUMMARY OF THE INVENTION

The circuitry of the present invention provides high current switching responsive to low power control signals while concurrently inhibiting transient signal switching of same. Control signal means, responsive to a low power level input signal, triggers complementary-symmetry arranged bipolar transistors which in turn control the conduction of a relatively high current carrying vertical metal oxide semiconductor transistor. The control means further provides reference voltage tracking means for insuring conduction of the VMOS only in response to an appropriate control signal. The present inventive circuitry provides high speed, low dissipative switching of high current while substantially eliminating transient signal switching of same.

DESCRIPTION OF THE DRAWINGS

In the drawing, where identical components are commonly designated;

FIG. 1 is a schematic representation of the circuitry of the present invention;

FIG. 2 is a preferred embodiment of the present invention's switching and transient suppression circuitry.

DETAILED DESCRIPTION OF THE INVENTION

Referring to FIG. 1, a driver amplifier having complementary-symmetry arranged first and second bipolar transistors 10 and 12, have main current conduction paths coupled in series relationship between floating reference potential terminal 20 and terminal 22 coupled to receive a voltage $V_1$. In a preferred embodiment, terminal 22 is maintained at voltage $V_1$ relative to terminal 20 by zener reference voltage supply 24 connected between the terminals; terminal 22 and supply 24 are further connected to a source of positive voltage $V_2$ through bias resistor 25. As shown, the zener reference supply 24 includes a zener diode 26 coupled in parallel with a filter capacitor 27. Zener reference supply 24 provides a regulated and filtered voltage $V_1$ to said terminal 22, and inhibits false triggering of the bipolar transistors 10 and 12 due to power supply transients.

Bipolar NPN and PNP transistors 10 and 12 are arranged in a complementary-symmetry configuration, having commonly connected base and emitter electrodes; said commonly connected bases being connected to terminal 28 for receiving a control input signal. As those of the art readily recognize, the above-described complementary-symmetry arrangement provides conduction through said first bipolar transistor 10 in response to terminal 28 receiving a control signal voltage which is sufficiently positive with respect to the common emitter potential of the transistors 10,12; conduction is provided through said second bipolar 12 when terminal 28 receives a control signal voltage which is sufficiently negative with respect to the common emitter potential of transistors 10,12. The term sufficient here refers to a threshold (or turn on voltage) characteristic of the particular bipolar transistor chosen; typically the threshold is between about 0.6 volts and 0.8 volts. In a preferred embodiment of the present invention, the bipolar transistors 10 and 12 have turn-on voltages of about plus and minus 0.7 volts respectively.

The output of the complementary-symmetry arranged bipolar driver amplifier including transistors 10 and 12 controls the switching of a vertical metal oxide semiconductor transistor (VMOS) 30 having a main current conduction path coupled between terminal 32 and reference terminal 20. The gate or control electrode 31 of the VMOS 30 is coupled to receive the common output of the complementary-symmetry arranged bipolar driver amplifier. The VMOS transistor 30 is a high current density, field effect device maintaining the high input inpedance and relatively fast switching characteristics of a field controlled, insulated gate transistor, yet providing the high current switching capability necessary in many analog applications.

Although VMOS devices have been shown capable of being driven directly from low power digital-type circuitry, the present invention utilizes the bipolar driver to substantially increase the switching speed of the circuitry and insure that the VMOS 30 is quickly driven into full saturation. The importance of the latter feature is recognized in considering the "on resistance" of a partially versus fully saturated or turned on VMOS and the capacitive impedance of the VMOS input during the turn-on process.

For purposes of clarification in the drawings, there presently exists no unilaterally accepted symbol for the VMOS device; the inventor schematically illustrates the VMOS transistor 30 as having a drain, source and insulated gate electrode. There is further shown a voltage breakdown diode connected between the gate and source electrodes of the VMOS transistor 30. The VMOS 30 is turned on or rendered conductive whenever a sufficiently positive voltage is applied to the gate electrode thereof, that is, whenever the gate electrode potential is positive relative to the source electrode potential by an amount equal to the threshold or turn-on voltage of the particular VMOS transistor utilized.

The VMOS 30 is a voltage controlled device having a static gate current drive requirement of typically less than about 100 nanoamperes. As such, the VMOS is susceptible to false or transient signal triggering. Furthermore, the dynamic impedance characteristics differ from static considerations, whereby the VMOS appears as a low impedance load to driving circuitry during switching operation. Since the intended application of the present circuitry is low power level control of high current switching, mistriggering or false switching may be highly detrimental to the load components, for not only would the desired control function be defeated by such transients, but a relatively high current would be applied to or removed from the load at an inappropriate time. The present invention provides simple yet effective means for minimizing false triggering of the VMOS transistor while concurrently providing low power dissipation and high speed switching of relatively high current in response to low power control signals. To achieve these features the floating reference potential at terminal 20 of the triggering devices to substantially follows the VMOS 30 reference potential when the VMOS is in a non-conducting state, and clamps the VMOS in a conductive state for an appropriate input control signal.

In the circuit arrangement shown in FIG. 1, control signal circuitry 34 includes means capable of providing first and second control signal levels for triggering the bipolar driver amplifier formed by transistors 10 and 12 in response to low power level input signals. The control signal circuitry 34 is characterized as providing a relatively low voltage signal of below about 3 volts to terminal 28 during said first control signal level and a relatively high voltage signal of above about 5 volts to terminal 28 during said second control signal level.

Applying the first control signal voltage to the base of bipolar transistors 10 and 12 clamps the first bipolar 10 in a non-conductive state and permits conduction through the second bipolar transistor 12, whereby the potential of the VMOS 30 gate electrode is clamped at essentially the potential of terminal 28. The term clamp refers to a feature of the circuit which holds or maintains a specified portion of the circuitry at or near a fixed voltage or condition. In the embodiment shown in FIG. 1, a conduction path shown in phantom at 35' is provided during said first control signal whereby terminal 28 is effectively coupled to reference potential terminal 20. In this operative condition, if reference potential fluctuations cause reference terminal 20 to attain a negative potential, that is negative with respect to its normal reference potential, terminal 28 substantially follows the transient reference potential. Conduction through bipolar 12 from the relatively positive gate electrode of the VMOS 30 permits the VMOS gate to track the negatively fluctuating reference potential, prohibiting unwanted turn on of the VMOS. In the event that reference potential terminal 20 fluctuates positive with respect to its normal potential, a diode 36, having an anode and cathode respectively coupled between the drain and source electrode of the VMOS 30 becomes forward biased and provide a low impedance bypass of the VMOS.

The presence of the second control signal level voltage at the base of bipolars 10 and 12 turns on bipolar 10 and provides a sufficient driving voltage to the gate of the VMOS 30 to quickly turn on the VMOS transistor. Concurrently, the second bipolar 10 is clamped in a non-conductive state whereby the VMOS 30 gate is isolated from terminal 20 and associated circuitry connected thereto.

Referring now to FIG. 2, there is shown a preferred embodiment of the switching circuit of the present invention having a control signal means 34 comprising cascaded pairs of complementary-symmetry arranged metal-oxide-semiconductor field-effect transistors, hereinafter COS/MOS FET's. As shown, control signal means 34 comprises first and second COS/MOS FET inverter amplifiers, 33 and 35 respectively; each inverter having series connected P and N channel field effect transistors, coupled between terminal 22 and reference potential terminal 20. As described heretofore for FIG. 1, a voltage $V_1$ is preferably supplied to terminal 22 by a zener reference supply 24 comprising the parallel connected zener diode 26 and filter capacitor 27 coupled between a voltage terminal 22 and reference terminal 20. An input terminal 38 for receiving a relatively low power input signal is coupled to commonly connected insulated gate electrodes of said first inverter amplifier 33.

A preferred input means, here illustrated in phantom, couples input signals to terminal 38 through a light-activated switching device 42 comprising a photo-diode or similar light responsive device. Diode 42, coupled between terminals 38 and 22, is optically coupled to an externally controlled light source 42'. Light source 42', comprising a light emitting diode or similarly low power illumination device, and diode 42 are preferred means for providing the earlier-described low power level input control signal. In the absence of illumination there is no conduction through diode 42 and terminal 38 is at or near the reference potential. The output of the first amplifier is coupled though resistor 40' to commonly connected gate electrodes of the second inverter amplifier 35. Resistor 40' and capacitor 40" comprise an integrating and bypass means 40, the functions of which are described hereinafter. The output of the second inverter amplifier 35 is connected to terminal 28 which represents a commonly coupled base electrode input to an emitter-follower arranged driver including bipolar transistors 10 and 12. As described for FIG. 1, the commonly coupled emitter electrodes of bipolars transistors 10 and 12 are connected to the gate electrode of VMOS transistor 30. Also, as shown and described heretofore, a collector to emitter path of first bipolar transistor 12 is coupled between voltage $V_1$ at terminal 22 and the VMOS gate electrode; an emitter to collector path of second bipolar transistor 12 is coupled between the VMOS gate and reference potential terminal 20.

The circuit of FIG. 2 represents a preferred means for providing immunity from transient signal switching in low power controlled switching of high current carrying devices. In the operation of this circuit, a relatively low power level control signal is coupled to terminal 38, the commonly coupled base electrodes of the first inverter amplifier. Those of the art recognize the noise immunity provided by the voltage threshold switching characteristics of the COS MOS/FET arrangement and the preferred optical coupling system shown in the drawing. The inverted and amplified signal is coupled to the input of the second inverter amplifier 35 through the integrator and bypass network 40 which comprises resistor 40' and capacitor 40". Predetermined values of capacitance and resistance are selected to shunt transients to terminal 20, bypassing the remaining switching circuitry. This combination enhances the noise immunity of the switching circuit without loading the control signal producing circuitry. The integrated control signal is reshaped and inverted by the second inverter amplifier 30, then coupled to terminal 28 having a predetermined delay relative to the original control signal. This positive voltage signal corresponds to the second control signal level described for FIG. 1 and typically is above about five volts. As described for the previous embodiment, this signal is amplified by the emitter-follower configuration of bipolar transistors 10 and 12 to rapidly drive the VMOS 30 into conduction. Bipolar transistor 12 is concurrently clamped in a non-conductive state, isolating the VMOS gate from reference terminal 20.

A second operative condition is the absence of an intentional control signal at terminal 38. During this operative condition, the present inventive circuitry provides substantial noise or transient switching immunity and concurrently minimizes control circuit dissipation. This results in a high efficiency, high speed switching circuit for low power logic type switching of high current carrying devices, having transient switching protection. Accordingly, in the absence of a sufficient signal at terminal 38, the P channel FET in the first inverter amplifier 33 remains in a conductive state, while the N channel complimentary device remains non-conductive. This in turn provides a sufficient voltage to terminal 44 to maintain the P channel FET of second inverter amplifier 34 in a non-conductive state and concurrently renders the N-channel FET conductive. In this operative condition, terminal 28 is clamped essentially at the reference ground potential of terminal 20 (less an insignificant voltage drop across the N channel FET). Thereby, negative fluctuations in the potential of terminal 20 permit conduction through bipolar transistor 12, allowing the gate electrode of the VMOS 30 to track the potential at terminal 20.

Quiescent power dissipation occurs only in the inverter amplifiers 33 and 35. Utilizing insulated gate devices, as shown, minimizes this dissipation, typically to the order of microamperes. Active or dynamic dissipation, that is during a turn on control signal, is also substantially minimized since the VMOS 30 maintains the characteristics of a high input impedance, insulated gate device. Only during the VMOS 30 transition from an off state to an on state do drive bipolar transistors 10 and 12 operate in a dissipative sense. This circuitry thereby achieves low power level switching of high current with minimized circuit dissipation.

Although described and illustrated as positive voltage supplied circuitry, those of the art readily recognize the application of the present invention to bipolarity or negative polarity circuitry.

What is claimed is:

1. A floating hybrid switching circuit comprising a VMOS transistor having a source drain path and a gate electrode, a pair of complementary series connected bipolar transistors having common base input electrodes and common output electrodes, the common output electrodes having the same nomenclature and being d.c. coupled to the gate electrode, said series transistors having a main current path between a power supply terminal and a floating reference terminal, said reference terminal being d.c. connected to one electrode of the field effect transistor source drain path and one electrode of the main path of the series transistors to maintain said one electrode at the same floating d.c. reference potential, a control circuit for deriving an output signal coupled to the common base electrodes, said output signal having first and second levels respectively causing a main current path of a first of the bipolar transistors to be cut off while a main current path of the second bipolar transistor is conducting and the main current path of the first bipolar transistor to be conducting while the main current path of the second bipolar transistor is cut off, the bipolar transistors when responsive to the first level maintaining the gate electrode at a predetermined constant voltage relative to the reference terminal via a low impedance path between the reference terminal and the gate electrode to cut off the VMOS transistor source drain path and when responsive to the second level coupling the voltage at the other electrode of the bipolar transistor main current path to the gate electrode to activate the VMOS transistor source drain path into a conducting state, and diode means connected between the reference terminal and the other electrode of the main current path of the bipolar transistors for maintaining a constant predetermined voltage difference between the reference terminal and the other electrode of the main current path of the bipolar transistors to prevent false triggering of the bipolar transistors in response to transient voltage variations between the power supply and reference terminals.

2. The circuit of claim 1 wherein the voltage at the reference terminal is susceptible to variations below a nominal voltage therefor, the control circuit including d.c. circuit means between the floating reference terminal and the common base electrodes for maintaining a constant voltage difference equal to the first voltage level and a low impedance between the floating reference terminal and the common base electrodes in response to the reference terminal having the negative variations while the control circuit derives the first voltage level, the control circuit providing a high impedance between the floating reference terminal and the common base electrodes while the control circuit derives the second voltage level.

3. The circuit of claim 1 wherein the voltage at the reference terminal is susceptible to variations above a nominal voltage therefor, further including a diode shunting the source drain path and polarized to pass current from the reference terminal in an opposite direction from the source drain path for bypassing the source drain path in response to the reference terminal having the positive variations while the control circuit derives the first voltage level, the control circuit providing a high impedance between the floating reference terminal and the common base electrodes while the control circuit derives the second voltage level.

4. A floating hybrid switching circuit comprising a VMOS transistor having a source drain path and a gate electrode, a pair of complementary series connected bipolar transistors having common base input electrodes and common output electrodes, the common output electrodes having the same nomenclature and being d.c. coupled to the gate electrode, said series transistors having a main current path between a power supply terminal and a floating reference terminal, said reference terminal being d.c. connected to one electrode of the field effect transistor source drain path and one electrode of the main path of the series transistors to maintain said one electrode at the same floating d.c. reference potential, a control circuit for deriving an output signal coupled to the common base electrodes, said output signal having first and second levels respectively causing a main current path of a first of the bipolar transistors to be cut off while a main current path of the second bipolar transistor is conducting and the main current path of the first bipolar transistor to be conducting while the main current path of the second bipolar transistor is cut off, the bipolar transistors when responsive to the first level maintaining the gate electrode at a predetermined constant voltage relative to the reference terminal via a low impedance path between the reference terminal and the gate electrode to cut off the VMOS transistor source drain path and when responsive to the second level coupling a forward biasing voltage to the gate electrode to activate the VMOS transistor source drain path into a conducting state, the voltage at the reference terminal being susceptible to variations below a nominal voltage therefor, the control circuit including d.c. circuit means between the floating reference terminal and the common base electrodes for maintaining a constant voltage difference equal to the first voltage level and a low impedance between the floating reference terminal and the common base electrodes in response to the reference terminal having the negative variations while the control circuit derives the first voltage level, the control circuit providing a high impedance between the floating reference terminal and the common base electrodes while the control circuit derives the second voltage level.

5. The circuit of claim 4 wherein the voltage at the reference terminal is susceptible to variations above a nominal voltage therefor, further including a diode shunting the source drain path and polarized to pass current from the reference terminal in an opposite direction from the source drain path for bypassing the source drain path in response to the reference terminal having the positive variations while the control circuit derives the first voltage level, the control circuit providing a high impedance between the floating reference terminal and the common base electrodes while the control circuit derives the second voltage level.

6. The circuit of claim 2, 4 or 5 wherein the control circuit includes a pair of complementary inverting field effect transistors having: series connected source drain paths connected to d.c. shunt the main current path of the bipolar transistors, common gate electrodes responsive to a bilevel signal and common output electrodes between the series connected source drain paths, the common output electrodes being d.c. coupled to the common base electrodes.

7. The circuit of claim 2, 4 or 5 wherein the control circuit includes first and second pairs of complementary inverting field effect transistors, the first pair of transistors being cascaded with the second pair of transistors by a d.c. circuit, each of the pair of transistors having series connected source drain paths connected to d.c. shunt the main current path of the bipolar transistors, common gate electrodes responsive to a bilevel signal and common output electrodes between the series connected source drain paths, the common output electrodes of the first pair being d.c. coupled to the common gate electrodes of the second pair, the common output electrodes of the second pair being d.c. coupled to the common base electrodes.

8. The circuit of claim 7 wherein the control circuit includes a bypass network connected between the first and second pairs of complementary inverting field effect transistors for shunting transient input signals coupled to the first pair of inverting complementary field effect transistors from an input of the second pair of inverting complementary field effect transistors to said floating reference terminal.

9. The circuit of claim 2 wherein the voltage at the reference terminal is susceptible to variations above a nominal voltage therefor, further including a diode shunting the source drain path and polarized to pass current from the reference terminal in an opposite direction from the source drain path for bypassing the source drain path in response to the reference terminal having the positive variations while the control circuit derives the first voltage level.

* * * * *